(12) United States Patent
Morales et al.

(10) Patent No.: US 8,332,194 B2
(45) Date of Patent: Dec. 11, 2012

(54) METHOD AND SYSTEM TO OBTAIN A COMPOSITIONAL MODEL OF PRODUCED FLUIDS USING SEPARATOR DISCHARGE DATA ANALYSIS

(75) Inventors: Fernando L. Morales, Poza Rica (MX); Juan Cruz Velazquez, Villahermosa (MX)

(73) Assignee: Schlumberger Technology Corporation, Sugar Land, TX (US)

( * ) Notice: Subject to any disclaimer, the term of this patent is extended or adjusted under 35 U.S.C. 154(b) by 808 days.

(21) Appl. No.: 12/182,068

(22) Filed: Jul. 29, 2008

(65) Prior Publication Data

US 2009/0032249 A1 Feb. 5, 2009

Related U.S. Application Data

(60) Provisional application No. 60/952,825, filed on Jul. 30, 2007.

(51) Int. Cl.
G06G 7/48 (2006.01)
(52) U.S. Cl. .................................. 703/10; 703/5; 703/9
(58) Field of Classification Search .................. 703/5, 9, 703/10
See application file for complete search history.

(56) References Cited

U.S. PATENT DOCUMENTS

| | | | |
|---|---|---|---|
| 5,139,094 A | 8/1992 | Prevedel et al. | |
| 5,680,906 A | 10/1997 | Andrieux et al. | |
| 5,899,958 A | 5/1999 | Dowell et al. | |
| 5,992,519 A | 11/1999 | Ramakrishnan et al. | |
| 6,266,619 B1 | 7/2001 | Thomas et al. | |
| 6,313,837 B1 | 11/2001 | Assa et al. | |
| 6,980,940 B1 | 12/2005 | Gurpinar et al. | |
| 7,003,439 B2 | 2/2006 | Aldred et al. | |
| 7,079,952 B2 | 7/2006 | Thomas et al. | |
| 2003/0132934 A1 | 7/2003 | Fremming | |
| 2003/0216897 A1 | 11/2003 | Endres et al. | |
| 2004/0104341 A1* | 6/2004 | Betancourt et al. | 250/255 |
| 2004/0220846 A1 | 11/2004 | Cullick et al. | |
| 2005/0149307 A1 | 7/2005 | Gurpinar et al. | |
| 2005/0209836 A1 | 9/2005 | Klumpen et al. | |
| 2005/0209886 A1 | 9/2005 | Corkern | |

(Continued)

FOREIGN PATENT DOCUMENTS

GB 2392931 3/2004

(Continued)

OTHER PUBLICATIONS

Pickering et al. "Evaluating New Chemicals and Alternatives for Mitigating Hydrates in Oil and Gas Production", 2001, IIR conference.*

(Continued)

Primary Examiner — Saif Alhija
(74) Attorney, Agent, or Firm — Colin Wier

(57) ABSTRACT

A method of performing production operations of an oilfield, including obtaining a sample of separator discharge fluid from a separator, performing gas chromatography on the separator discharge fluid to obtain gas molar composition, performing oil characterization on the separator discharge fluid to obtain oil density and oil molecular weight, performing a simulation of the separator based on the gas molar composition, the oil density, the oil molecular weight, and a gas oil ratio (GOR) of the separator discharge fluid to obtain a simulated composition of separator inlet fluid, and presenting the simulated composition of separator inlet fluid, when the difference between the actual composition of separator outlet fluid and the simulated composition of separator outlet fluid is less than a threshold value.

22 Claims, 6 Drawing Sheets

U.S. PATENT DOCUMENTS

| | | |
|---|---|---|
| 2005/0211468 A1 | 9/2005 | Veeningen et al. |
| 2005/0228905 A1 | 10/2005 | Veeningen et al. |
| 2005/0236184 A1 | 10/2005 | Veeningen et al. |
| 2005/0252286 A1 | 11/2005 | Ibrahim et al. |
| 2006/0197759 A1 | 9/2006 | Fremming |
| 2007/0100478 A1* | 5/2007 | Egeland et al. ............ 700/45 |
| 2007/0112547 A1 | 5/2007 | Ghorayeb et al. |

FOREIGN PATENT DOCUMENTS

| | | |
|---|---|---|
| GB | 2411669 | 9/2005 |
| WO | 9964896 | 12/1999 |
| WO | 2004049216 | 6/2004 |

OTHER PUBLICATIONS

SPM-3000 Gas Oil Seperation Process, 2006.*

New Solutions in Fluid Sampling, Middle East & Asia Reservoir Review, 2005, pp. 6-23, No. 6.

Riazi, M. R. et al. The Impact of Characterization Methods on Properties of Reservoir Fluids and Crude Oils: Options and Restrictions, Journal of Petroleum Science & Engineering, 2004, pp. 195-207, vol. 42.

Nagarajan, N. R. et al, Reservoir-Fluid Sampling and Characterization-Key to Efficient Reservoir Management, Journal of Petroleum Technology, Aug. 2007, pp. 80-91.

* cited by examiner

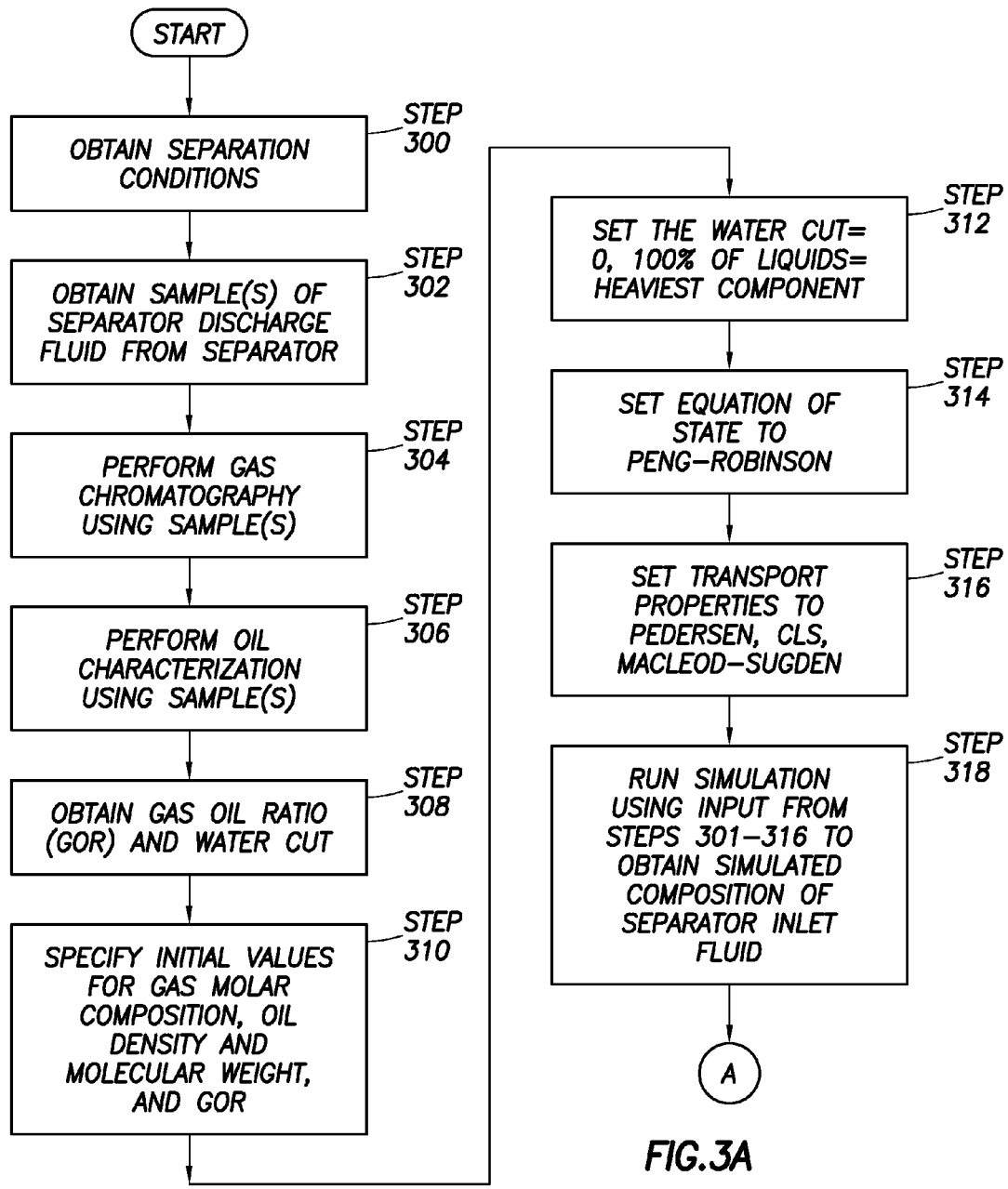

METHOD AND SYSTEM TO OBTAIN A COMPOSITIONAL MODEL OF PRODUCED FLUIDS USING SEPARATOR DISCHARGE DATA ANALYSIS

CROSS REFERENCE TO RELATED APPLICATIONS

This application claims priority under 35 U.S.C. §119(e) from Provisional Patent Application No. 60/952,825 filed Jul. 30, 2007.

BACKGROUND

Oilfield operations, such as surveying, drilling, wireline testing, completions and production, are typically performed to locate and gather valuable downhole fluids. As shown in FIG. 1A, surveys are often performed using acquisition methodologies, such as seismic scanners to generate maps of underground structures. These structures are often analyzed to determine the presence of subterranean assets, such as valuable fluids or minerals. This information is used to assess the underground structures and locate the formations containing the desired subterranean assets. Data collected from the acquisition methodologies may be evaluated and analyzed to determine whether such valuable items are present, and if they are reasonably accessible.

As shown in FIG. 1B-1D, one or more wellsites may be positioned along the underground structures to gather valuable fluids from the subterranean reservoirs. The wellsites are provided with tools capable of locating and removing hydrocarbons from the subterranean reservoirs. As shown in FIG. 1B, drilling tools are typically advanced from the oil rigs and into the earth along a given path to locate the valuable downhole fluids. During the drilling operation, the drilling tool may perform downhole measurements to investigate downhole conditions. In some cases, as shown in FIG. 1C, the drilling tool is removed and a wireline tool is deployed into the wellbore to perform additional downhole testing.

After the drilling operation is complete, the well may then be prepared for production. As shown in FIG. 1D, wellbore completions equipment is deployed into the wellbore to complete the well in preparation for the production of fluid therethrough. Fluid is then drawn from downhole reservoirs, into the wellbore and flows to the surface. Production facilities are positioned at surface locations to collect the hydrocarbons from the wellsite(s). Fluid drawn from the subterranean reservoir(s) passes to the production facilities via transport mechanisms, such as tubing. Various equipment may be positioned about the oilfield to monitor oilfield parameters and/or to manipulate the oilfield operations.

During the oilfield operations, data is typically collected for analysis and/or monitoring of the oilfield operations. Such data may include, for example, subterranean formation, equipment, historical and/or other data. Data concerning the subterranean formation is collected using a variety of sources. Such formation data may be static or dynamic. Static data relates to formation structure and geological stratigraphy that defines the geological structure of the subterranean formation. Dynamic data relates to fluids flowing through the geologic structures of the subterranean formation, as well as pressure and temperature conditions. Such static and/or dynamic data may be collected to learn more about the formations and the valuable assets contained therein.

Sources used to collect static data may be seismic tools, such as a seismic truck that sends compression waves into the earth as shown in FIG. 1A. These waves are measured to characterize changes in the density of the geological structure at different depths. This information may be used to generate basic structural maps of the subterranean formation. Other static measurements may be gathered using core sampling and well logging techniques. Core samples are used to take physical specimens of the formation at various depths as shown in FIG. 1B. Well logging involves deployment of a downhole tool into the wellbore to collect various downhole measurements, such as density, resistivity, etc., at various depths. Such well logging may be performed using, for example, the drilling tool of FIG. 1B and/or the wireline tool of FIG. 1C. Once the well is formed and completed, fluid flows to the surface using production tubing as shown in FIG. 1D. As fluid passes to the surface, various dynamic measurements, such as fluid flow rates, pressure, and composition may be monitored. These parameters may be used to determine various characteristics of the subterranean formation.

Sensors may be positioned throughout the oilfield to collect data relating to various oilfield operations. For example, sensors in the wellbore may monitor fluid composition, sensors located along the flow path may monitor flow rates, and sensors at the processing facility may monitor fluids collected. Other sensors may be provided to monitor downhole, surface, equipment or other conditions. The monitored data is often used to make decisions at various locations of the oilfield at various times. Data collected by these sensors may be further analyzed and processed. Data may be collected and used for current or future operations. When used for future operations at the same or other locations, such data may sometimes be referred to as historical data.

The processed data may be used to predict downhole conditions, and make decisions concerning oilfield operations. Such decisions may involve well planning, well targeting, well completions, operating levels, production rates and other configurations. Often this information is used to determine when to drill new wells, re-complete existing wells, or alter wellbore production.

Data from one or more wellbores may be analyzed to plan or predict various outcomes at a given wellbore. In some cases, the data from neighboring wellbores, or wellbores with similar conditions or equipment is used to predict how a well will perform. There are usually a large number of variables and large quantities of data to consider in analyzing wellbore operations. It is, therefore, often useful to model the behavior of the oilfield operation to determine the desired course of action. During the ongoing operations, the operating conditions may need adjustment as conditions change and new information is received.

Techniques have been developed to model the behavior of geological structures, downhole reservoirs, wellbores, surface facilities, as well as other portions of the oilfield operation. Examples of modeling techniques are shown in Patent/Application/Publication Nos. U.S. Pat. No. 5,992,519, WO2004049216, WO1999/064896, U.S. Pat. No. 6,313,837, US2003/0216897, US2003/0132934, US2005/0149307, and US2006/0197759. Typically, existing modeling techniques have been used to analyze only specific portions of the oilfield operation. More recently, attempts have been made to use more than one model in analyzing certain oilfield operations. See, for example, Patent/Application/Publication Nos. U.S. Pat. No. 6,980,940, WO04049216, US2004/0220846, and U.S. Ser. No. 10/586,283.

Techniques have also been developed to predict and/or plan certain oilfield operations, such as drilling operations. Examples of techniques for generating drilling plans are provided in Patent/Application/Publication Nos. US/2005/0236184, US/2005/0211468, US/2005/0228905, US/2005/

0209886, and US/2005/0209836. Some drilling techniques involve controlling the drilling operation. Examples of such drilling techniques are shown in Patent/Application Nos. GB2392931 and GB2411669. Other drilling techniques seek to provide real-time drilling operations. Examples of techniques purporting to provide real-time drilling are described in Patent/Application Nos. U.S. Pat. Nos. 7,079,952, 6,266,619, 5,899,958, 5,139,094, 7,003,439, and 5,680,906.

FIG. 2A shows a schematic view of a portion of the oilfield (100) of FIGS. 1A-1D, depicting the wellsite and gathering network (146) in detail. The wellsite of FIG. 2A has a wellbore (136) extending into the earth therebelow. As shown, the wellbore (136) has already been drilled, completed, and prepared for production from reservoir (104). Wellbore production equipment (164) extends from a wellhead (166) of wellsite and to the reservoir (104) to draw fluid to the surface. The wellsite is operatively connected to the gathering network (146) via a transport line (161). Fluid flows from the reservoir (104), through the wellbore (136), and onto the gathering network (146). The fluid then flows from the gathering network (146) to the process facilities (154).

As further shown in FIG. 2A, sensors (S) are located about the oilfield to monitor various parameters during oilfield operations. The sensors (S) may measure, for example, pressure, temperature, flow rate, composition, and other parameters of the reservoir, wellbore, gathering network, process facilities and other portions of the oilfield operation. These sensors (S) are operatively connected to a surface unit (134) for collecting data therefrom.

One or more surface units (e.g., surface unit (134)) may be located at the oilfield, or linked remotely thereto. The surface unit (134) may be a single unit, or a complex network of units used to perform the necessary data management functions throughout the oilfield. The surface unit (134) may be a manual or automatic system. The surface unit (134) may be operated and/or adjusted by a user. The surface unit (134) is adapted to receive and store data. The surface unit (134) may also be equipped to communicate with various oilfield equipment. The surface unit (134) may then send command signals to the oilfield in response to data received.

The surface unit (134) has computer facilities, such as memory (220), controller (222), processor (224), and display unit (226), for managing the data. The data is collected in memory (220), and processed by the processor (224) for analysis. Data may be collected from the oilfield sensors (S) and/or by other sources. For example, oilfield data may be supplemented by historical data collected from other operations, or user inputs.

The analyzed data may then be used to make decisions. A transceiver (not shown) may be provided to allow communications between the surface unit (134) and the oilfield. The controller (222) may be used to actuate mechanisms at the oilfield via the transceiver and based on these decisions. In this manner, the oilfield may be selectively adjusted based on the data collected. These adjustments may be made automatically based on computer protocol and/or manually by an operator. In some cases, well plans are adjusted to select optimum operating conditions, or to avoid problems.

To facilitate the processing and analysis of data, simulators are typically used by the processor to process the data. Specific simulators are often used in connection with specific oilfield operations, such as reservoir or wellbore production. Data fed into the simulator(s) may be historical data, real time data, or combinations thereof. Simulation through one or more of the simulators may be repeated, or adjusted based on the data received.

As shown, the oilfield operation is provided with wellsite and non-wellsite simulators. The wellsite simulators may include a reservoir simulator (149), a wellbore simulator (192), and a surface network simulator (194). The reservoir simulator (149) solves for petroleum flow through the reservoir rock and into the wellbores. The wellbore simulator (192) and surface network simulator (194) solves for petroleum flow through the wellbore and the surface gathering network (146) of pipelines. As shown, some of the simulators may be separate or combined, depending on the available systems.

The non-wellsite simulators may include process and economics simulators. The processing unit has a process simulator (148). The process simulator (148) models the processing plant (e.g., the process facility (154)) where the petroleum is separated into its constituent components (e.g., methane, ethane, propane, etc.) and prepared for sales. The oilfield is provided with an economics simulator (147). The economics simulator (147) models the costs of part or all of the oilfield. Various combinations of these and other oilfield simulators may be provided.

SUMMARY OF THE INVENTION

In general, in one aspect, the invention relates to a method of performing production operations of an oilfield having at least one process facility and at least one wellsite operatively connected thereto, each at least one wellsite having a wellbore penetrating a subterranean formation for extracting fluid from an underground reservoir therein. The method steps include obtaining a sample of separator discharge fluid from a separator, wherein the separator receives fluid extracted from the underground reservoir, performing gas chromatography on the separator discharge fluid to obtain gas molar composition, performing oil characterization on the separator discharge fluid to obtain oil density and oil molecular weight, performing a first simulation using the gas molar composition, the oil density, the oil molecular weight, and a gas oil ratio (GOR) of the separator discharge fluid to obtain a simulated composition of separator inlet fluid, wherein the first simulation is performed using a simulator, performing a second simulation using the simulated composition of separator inlet fluid to obtain a simulated composition of separator outlet fluid, wherein the second simulation is performed using the simulator, comparing the simulated composition of separator outlet fluid to an actual composition of separator outlet fluid, wherein the actual composition of the separator outlet fluid is obtained from the sample, and presenting the simulated composition of separator inlet fluid, when the difference between the actual composition of separator outlet fluid and the simulated composition of separator outlet fluid is less than a threshold value.

In general, in one aspect, the invention relates to a method of performing production operations of an oilfield having at least one process facility and at least one wellsite operatively connected thereto, each at least one wellsite having a wellbore penetrating a subterranean formation for extracting fluid from an underground reservoir therein. The method steps include obtaining a sample of separator discharge fluid from a separator, wherein the separator is receives fluid from the underground reservoir, performing gas chromatography on the separator discharge fluid to obtain gas molar composition, performing oil characterization on the separator discharge fluid to obtain oil density and oil molecular weight, performing a first simulation using the gas molar composition, the oil density and oil molecular weight, a gas oil ratio (GOR) of the separator discharge fluid to obtain a simulated composition of separator inlet fluid, wherein the first simulation is performed using a simulator, performing a second simulation using the simulated composition of separator inlet fluid to obtain a simulated composition of separator outlet fluid, wherein the second simulation is performed using the simulator, comparing the simulated composition of separator outlet fluid to an actual composition of separator outlet fluid, wherein the actual composition of the separator outlet fluid is obtained from the sample, and updating production operations using the simulated composition of separator inlet fluid, when the difference between the actual composition of separator outlet fluid and the simulated composition of separator outlet fluid is less than a threshold value.

In general, in one aspect, the invention relates to a computer readable medium, embodying instructions executable by the computer to perform method steps for performing production of an oilfield having at least one process facilities and at least one wellsite operatively connected thereto, each at least one wellsite having a wellbore penetrating a subterranean formation for extracting fluid from an underground reservoir therein. The instructions comprising functionality to obtain a sample of separator discharge fluid from a separator, wherein the separator is receives fluid from the underground reservoir, perform gas chromatography on the separator discharge fluid to obtain gas molar composition, perform oil characterization on the separator discharge fluid to obtain oil density and oil molecular weight, perform a first simulation using the gas molar composition, the oil density and oil molecular weight, a gas oil ratio (GOR) of separator discharge fluid to obtain a simulated composition of separator inlet fluid, wherein the first simulation is performed using a simulator, perform a second simulation using the simulated composition of separator inlet fluid to obtain a simulated composition of separator outlet fluid, wherein the second simulation is performed using the simulator, compare the simulated composition of separator outlet fluid to an actual composition of separator outlet fluid, wherein the actual composition of the separator outlet fluid is obtained from the sample, and present the simulated composition of separator inlet fluid, when the difference between the actual composition of separator outlet fluid and the simulated composition of separator outlet fluid is less than a threshold value.

In general, in one aspect, the invention relates to a computer readable medium, embodying instructions executable by the computer to perform method steps for performing production of an oilfield having at least one process facilities and at least one wellsite operatively connected thereto, each at least one wellsite having a wellbore penetrating a subterranean formation for extracting fluid from an underground reservoir therein. The instructions comprising functionality to obtain a sample of separator discharge fluid from a separator, wherein the separator is receives fluid from the underground reservoir, perform gas chromatography on the separator discharge fluid to obtain gas molar composition, perform oil characterization on the separator discharge fluid to obtain oil density and oil molecular weight, perform a first simulation using the gas molar composition, the oil density and oil molecular weight, a gas oil ratio (GOR) of the separator discharge fluid to obtain a simulated composition of separator inlet fluid, wherein the first simulation is performed using a simulator, perform a second simulation using the simulated composition of separator inlet fluid to obtain a simulated composition of separator outlet fluid, wherein the second simulation is performed using the simulator, compare the simulated composition of separator outlet fluid to an actual composition of separator outlet fluid, wherein the actual composition of the separator outlet fluid is obtained from the sample, and update production operations using the simulated composition of separator inlet fluid, when the difference between the actual composition of separator outlet fluid and the simulated composition of separator outlet fluid is less than a threshold value.

Other aspects and advantages of the invention will be apparent from the following description and the appended claims.

DETAILED DESCRIPTION

Figure 1A:
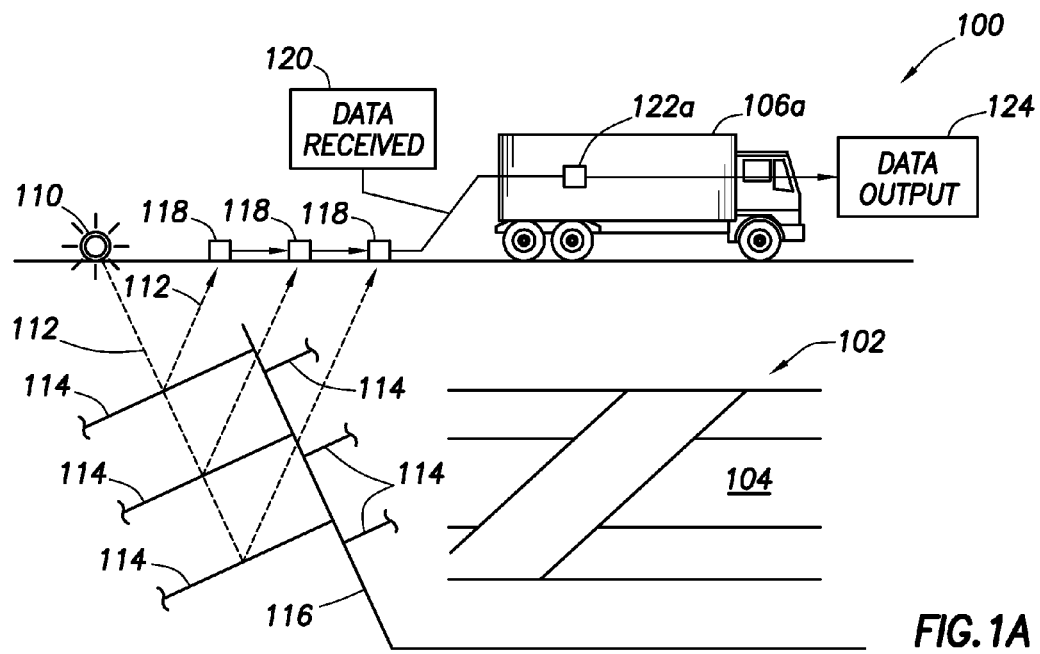
FIGS. 1A-1D depict a schematic view of an oilfield having subterranean structures including reservoirs therein, various oilfield operations being performed on the oilfield.
Figure 1B:
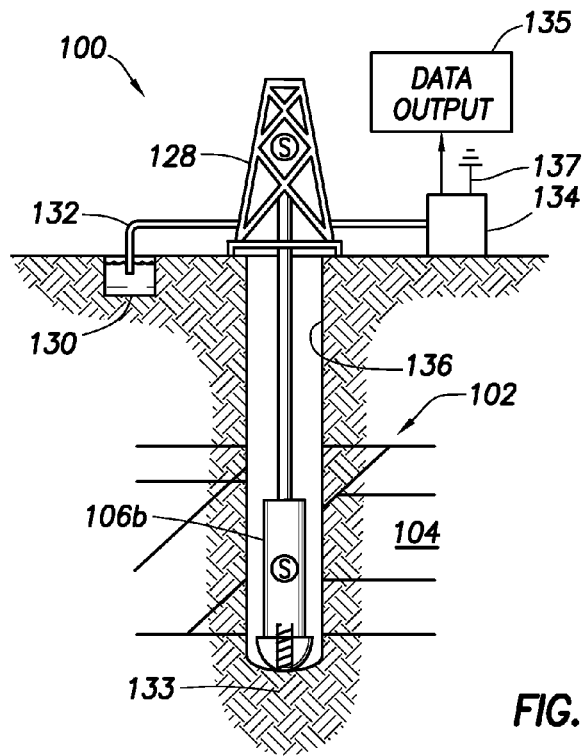
Figure 1C:
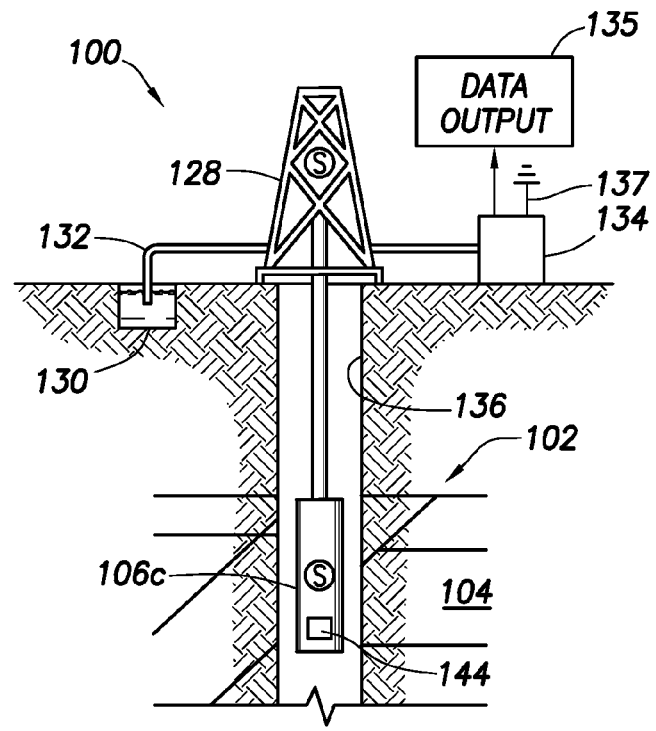
Figure 1D:
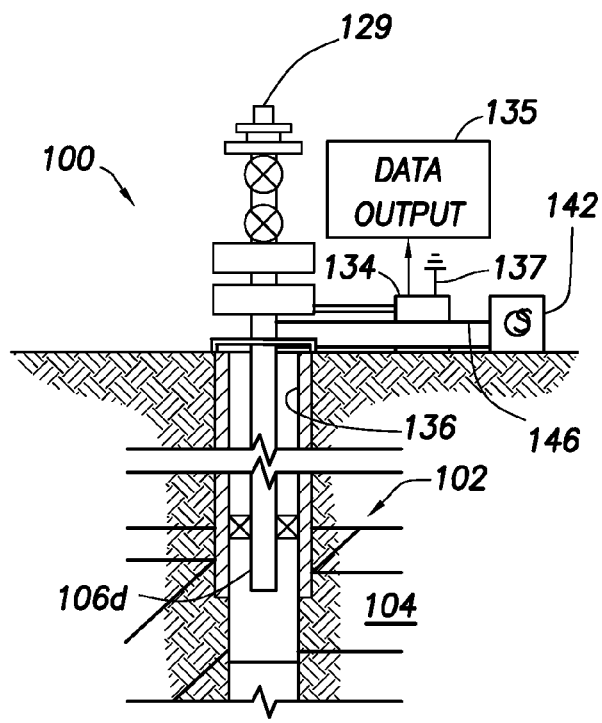

Exemplary embodiments of the invention will now be described in detail with reference to the accompanying figures. Like items in the figures are denoted with like reference numerals for consistency.

In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Fluid characterization data used to build representative reservoir fluid models for reservoir and production engineering is generally scarce and very costly due to the expense of fluid sampling and analysis as well as operational related problems of well intervention. The problem may even be more severe when the field to be studied has been producing for some time and its bottom-hole pressure has reached the bubble point. In those cases, initial reservoir fluid data is more difficult to be used as some portion of the hydrocarbon's heaviest or lightest components, whether oil or gas is produced, may have been left in the reservoir and initial Pressure Volume Temperature (PVT) data is no longer valid or very difficult to match to current fluid behavior.

One of the most common practices of obtaining fluid data is by taking well bottom-hole samples, or by obtaining surface oil and gas mixture samples and analyzing them in the laboratory using recombined methods. Due to the costs involved (e.g., loss of time and production) operating companies do not obtain fluid data with the required frequency. Accordingly, engineers are left with the only option of using non-updated or insufficient data that will affect the outcome of their simulation studies.

In general, the invention relates to a method and system for obtaining a compositional model of produced fluids using separator discharge data analysis. More specifically, embodiments of the invention relate to a method and system for determining the composition of inlet fluid at a separator. Using the composition of the inlet fluid, users may gain a better understanding of the properties of the fluid currently in the reservoir and adjust the current production operations accordingly. One or more embodiments of the invention provide a fast, low cost, and non-invasive (i.e., drilling is not required) method and/or system for obtaining information about the properties of the fluid currently in the reservoir.

Figure 2A:
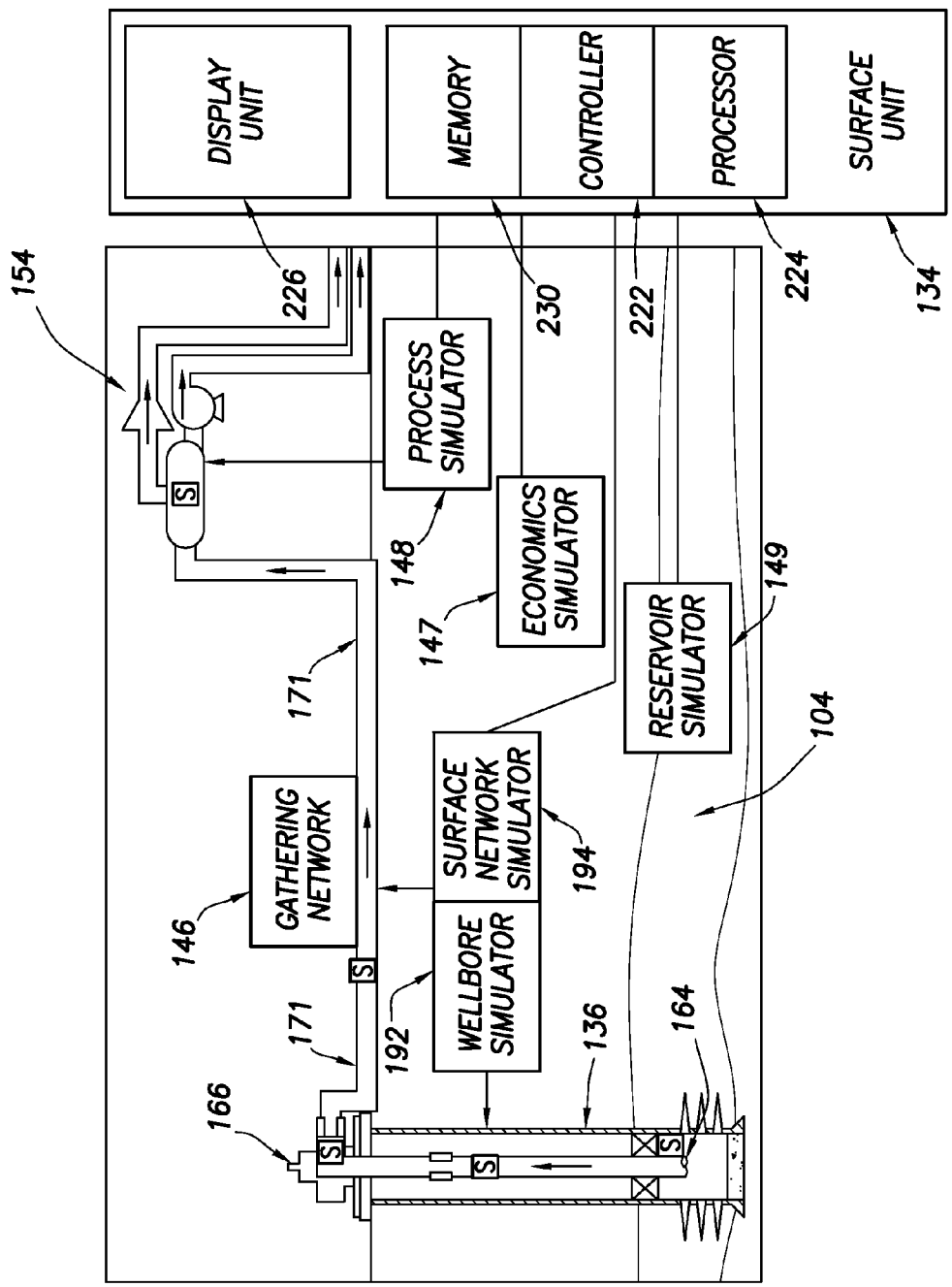
FIG. 2A shows a schematic view of a portion of the oilfield of FIGS. 1A-1D, depicting the wellsite and gathering network in detail.
Figure 2B:
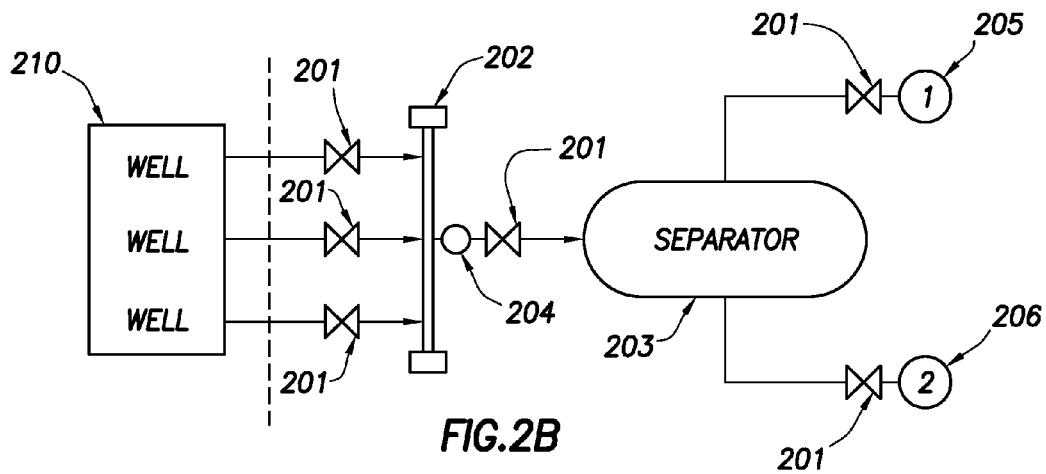
FIG. 2B shows a schematic view of a portion of the oilfield of FIGS. 1A-1D, depicting a portion of the process facility in detail.

FIG. 2B shows a schematic view of a portion of the oilfield of FIGS. 1A-1D, depicting a portion of the process facility in detail. As shown in FIG. 2B, fluid extracted from an underground reservoir through wells (210) is directed to a manifold (202) before enters a separator (203). The separator (203) is shown to receive inlet fluid (204) and produce discharge gas (205) and discharge liquid (206). The wells (210), the manifold (202), and the separator (203) are connected via pipeline network controlled by valves (201). Although three wells, one manifold, one separator are shown in FIG. 2B, those skilled in the art will appreciate any number of these components may be present in the oilfield and processing facility. Further, the separator may be configured with more than two discharge outputs.

In one embodiment of the invention, the separator corresponds to a cylindrical or spherical vessel used to separate oil, gas and water from the total fluid stream produced by a well. Separators can be either horizontal or vertical. Separators can be classified into two-phase and three-phase separators (commonly called free-water knockout). The two-phase type deals only with oil and gas, while the three-phase type handles oil, water and gas. Additionally, separators can be categorized according to their operating pressure. Low-pressure units handle pressures of 10 to 180 psi [69 to 1241 kPa]. Medium-pressure separators operate from 230 to 700 psi [1586 to 4826 kPa]. High-pressure units handle pressures of 975 to 1500 psi [6722 to 10,342 kPa]. Gravity segregation is the main force that accomplishes the separation, which means the heaviest fluid settles to the bottom and the lightest fluid rises to the top. Additionally, inside the vessel, the degree of separation between gas and liquid will depend on the separator operating pressure, the residence time of the fluid mixture and the type of flow of the fluid. Turbulent flow allows more bubbles to escape than laminar flow.

In one embodiment of the invention, the separator is a first stage separator. In one embodiment of the invention, using the first stage separator minimizes any deviation due to the solution gas that could be present at the separator's discharge fluid and not taken into account in the gas composition analysis of the separator gas discharge.

Generally speaking, the inlet fluid (204) is multi-phase multi-component fluid comprising various hydrocarbon components. As described with respect to FIG. 2A above, simulators are provided for modeling the oilfield operation. In one embodiment of the invention, the operation of the separator (203) may be modeled by a multiflash simulator (e.g., PVT Lab Fluid Analysis) configured for calculating the amounts of flashed vapor (e.g., the discharge gas (205)) and residual liquid (e.g., the discharge liquid (206)) derived from the inlet fluid (204) and in equilibrium with each other at a given temperature and pressure.

TABLE 1

| Component | Gas Molar % | Liquid Molar % |
|---|---|---|
| NITROGEN | 2.741000 | |
| H2S | 1.045000 | |
| CO2 | 4.638000 | |
| METHANE | 81.44900 | |
| ETHANE | 8.315000 | |
| PROPANE | 0.2370000 | |
| ISOBUTANE | 0.6010000 | |

TABLE 1-continued

| Component | Gas Molar % | Liquid Molar % |
|---|---|---|
| N-BUTANE | 9.3000000E−02 | |
| ISOPENTANE | 0.3400000 | |
| N-PENTANE | 0.3140000 | |
| C6 | 0.2260000 | |
| C7+ | 1.0000000E−03 | 100.0000 |

TABLE 2

| Component | Gas Molar % | Liquid Molar % |
|---|---|---|
| NITROGEN | 2.7427 | 0.0099 |
| H2S | 1.0431 | 0.1378 |
| CARBON DIOXIDE | 4.6362 | 0.2590 |
| METHANE | 81.4880 | 0.9080 |
| ETHANE | 8.3090 | 0.6116 |
| PROPANE | 0.2359 | 0.0680 |
| ISOBUTANE | 0.5929 | 0.4436 |
| BUTANE | 0.0911 | 0.1012 |
| ISOPENTANE | 0.3263 | 0.9655 |
| PENTANE | 0.2873 | 1.1645 |
| HEXANE | 0.1781 | 2.5029 |
| C7+ | 0.0694 | 92.8282 |

TABLE 3

| Component | Molar % |
|---|---|
| NITROGEN | 2.69125 |
| H2S | 1.02603 |
| CO2 | 4.55382 |
| METHANE | 79.9707 |
| ETHANE | 8.16408 |
| PROPANE | 0.232698 |
| ISOBUTANE | 0.590092 |
| N-BUTANE | 9.131205E−02 |
| ISOPENTANE | 0.333829 |
| N-PENTANE | 0.308301 |
| C6 | 0.221898 |
| C7+ | 1.81598 |

Figure 3B:
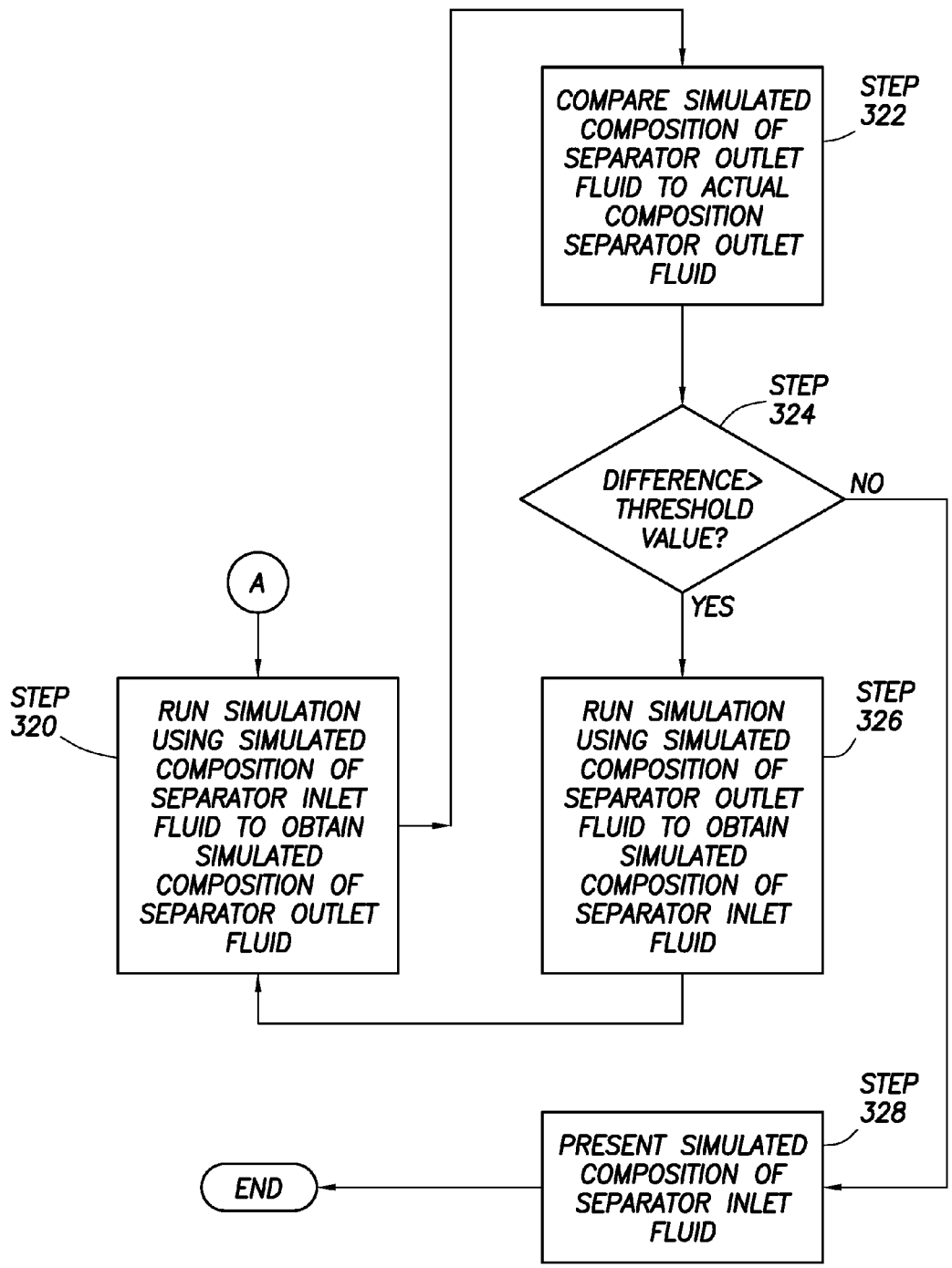
FIG. 3 shows a flow chart in accordance with one or more embodiments of the invention.

FIG. 3 shows a flowchart in accordance with one or more embodiments of the invention. In one or more embodiments, one or more of the steps shown in FIG. 3 may be omitted, repeated, and/or performed in a different order than that shown in FIG. 3. Accordingly, the specific arrangement of steps shown in FIG. 3 should not be construed as limiting the scope of the invention.

In Step 300, separation conditions are obtained. In one embodiment of the invention, the separation conditions are conditions at which the separator is operating. Examples of separation conditions may include, but are not limited to, pressure and temperature.

In Step 302, a sample(s) of separator discharge fluid is obtained. In one embodiment of the invention, the sample(s) of separator discharge fluid is a multiphase fluid that includes, for example, oil, gas, and water. In Step 304, gas chromatography is performed on the sample(s) of separator discharge fluid. The results of performing the gas chromatography may include the gas molar composition in the sample(s) of separator discharge fluid. An example of the gas molar composition in the separator discharge gas (205) is shown in TABLE 1.

In Step 306, oil characterization is performed on the sample(s) of separator discharge fluid. The results of performing the oil characterization include the oil density and molecular weight for the oil in the sample(s) of separator discharge fluid. An example of the oil characterization result in the separator discharge liquid (206) is shown in TABLE 1 as 100% C7+.

In Step 308, the gas/oil ratio (GOR) in the sample(s) of separator discharge fluid and the water cut in the sample(s) of separator discharge fluid is obtained using the sample(s) of separator discharge fluid and/or other fluid(s) from the separator.

In Step 310, the initial values for gas molar composition (obtained from Step 304), oil density and molecular weight (obtained from Step 306), and GOR (obtained in Step 308) are input into a multiflash simulator (e.g., PVT Lab Fluid Analysis). In Step 312, the water cut is set to zero (i.e., no water is present in the fluid) and 100% of the liquid is set to the heaviest liquid component (e.g., C7+). In Step 314, the Equation of States is set to Peng-Robinson (PR). In step 316, the transport properties are set to Pedersen (i.e., the name of the model used to determine fluid viscosity), Chung-Lee-Starling (CLS) (i.e., the name of the model used to calculate surface tension), and Macleod-Sugden (i.e., the name of the model used to calculate thermal conductivity).

In Step 318, a multiflash simulation is run on the multiflash simulator using the input from Steps 301-316 to obtain a simulated composition of separator inlet fluid. An example of the simulated composition of separator inlet fluid (204) with combined gas/liquid molar percentage is shown in TABLE 2. Note the predominant gas phase indicated by the relative small percentage of C7+ component. Thus, after Step 318 a first approximation of the composition of the separator inlet fluid is obtained. In Step 320, the simulated composition of separator inlet fluid obtained in Step 318 is used as an input into the multiflash simulation. The simulation is subsequently run to obtain the simulated composition of separator outlet fluid. The simulation is run at the current operating conditions of the separator (see Step 300).

In Step 322, the simulated composition of separator outlet fluid is compared to the actual composition of separator outlet fluid (as measured in Steps 304-308). The comparison includes comparing the following properties of the actual and simulated composition of the separator outlet fluid: liquid phase properties (e.g., density, molecular weight, and viscosity), molar composition of each component in the separator outlet fluid, and the difference (on a molar composition basis) between the between the liquid phase of simulated and actual separator outlet fluid.

In Step 324, if the difference between the simulated and actual separator outlet fluid is greater than a threshold value (or otherwise non-negligible), then the process proceeds to Step 326. Alternatively, the process proceeds to Step 328.

In Step 326, the simulation is run using the simulated composition of the separator outlet fluid (obtained in Step 320) to obtain an updated simulated composition of the separator inlet fluid. The process then proceeds to Step 320, where the simulation is run using the updated simulated composition of the separator inlet fluid to obtain an updated simulated composition of the separator outlet fluid.

In Step 328, the simulated composition of the separator inlet fluid is presented to the user. An example of the simulated composition of separator inlet fluid (204) is shown in TABLE 3 with separate columns for gas phase and liquid phase. In one embodiment of the invention, presenting the simulated composition of the separator inlet fluid includes displaying the simulated composition of the separator inlet fluid on a computer screen to the user. Alternatively, presenting the simulated composition of the separator inlet fluid includes generating a printout of the simulated composition of the separator inlet fluid. In one embodiment of the invention, the simulated composition of the separator inlet fluid is used to update the production operations of the well or set of wells. In one embodiment of the invention, production operations may be updated in real-time.

In one embodiment of the invention, estimate a fluid model generated using the methodology described with respect to FIG. 3 is used to simulate well behavior, reproduce pressure loss through production lines, and reproduce liquids and gas rates at the separators discharge in an oilfield production system. Initially, well models, network models, and separation facility models are constructed as depicted in FIGS. 2A and 2B above. In addition, the synthetic fluid model generated using method steps of FIG. 3 is input in all wells. Furthermore, water cut and GOR are modified on individual well basis to represent actual production conditions of each well.

In one embodiment of the invention, validity of the synthetic fluid model is verified for each well using last available flowing pressure/temperature profile and corresponding oil/gas/water rate measurements to select the most suitable multiphase flow equation. In one embodiment of the invention, friction and hold up factors are fine tuned to adjust the pressure/temperature profile.

In one embodiment of the invention, the integrated simulation model includes synthetic fluid models, well models, network model (flow lines, gas transfer lines, etc.), separation station models, compression facility models, etc. all running in an integrated environment dynamically transferring mass flow, composition, pressure, and temperature between the models.

Figure 4:
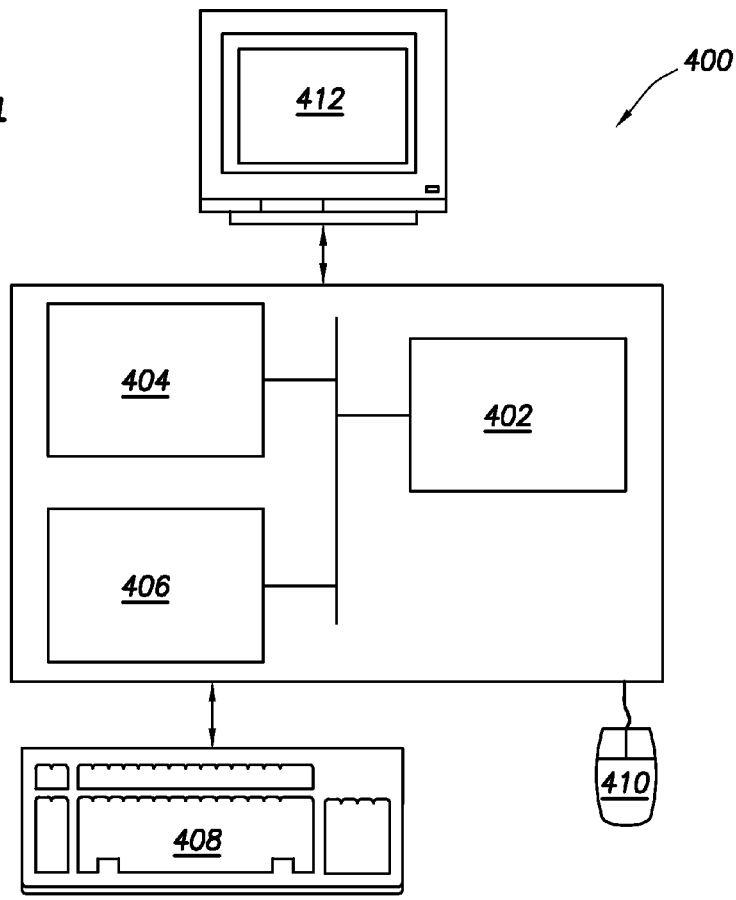
FIG. 4 shows a computer system in accordance with one or more embodiments of the invention.

The invention may be implemented on virtually any type of computer regardless of the platform being used. For example, as shown in FIG. 4, a networked computer system (400) includes a processor (402), associated memory (404), a storage device (406), and numerous other elements and functionalities typical of today's computers (not shown). The networked computer (400) may also include input means, such as a keyboard (408) and a mouse (410), and output means, such as a monitor (412). The networked computer system (400) is connected to a local area network (LAN) or a wide area network (e.g., the Internet) (not shown) via a network interface connection (not shown). Those skilled in the art will appreciate that these input and output means may take other forms, now known or later developed. Further, those skilled in the art will appreciate that one or more elements of the aforementioned computer (400) may be located at a remote location and connected to the other elements over a network.

Further, the invention may be implemented on a distributed system having a plurality of nodes, where each portion of the invention may be located on a different node within the distributed system. In one embodiment of the invention, the node corresponds to a computer system. Alternatively, the node may correspond to a processor with associated physical memory. Further, software instructions to perform embodiments of the invention may be stored on a computer readable medium such as a compact disc (CD), a diskette, a tape, a file, or any other computer readable storage device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of performing production operations of an oilfield having at least one process facility and at least one wellsite operatively connected thereto, each at least one wellsite having a wellbore penetrating a subterranean formation for extracting fluid from an underground reservoir therein, the method comprising:

obtaining, during operation of a separator, a sample of separator discharge fluid from the separator, wherein the separator is (a) receiving separator inlet fluid extracted from the underground reservoir and (b) separating oil, gas, and water from the separator inlet fluid to produce the separator discharge fluid;

performing gas chromatography on the separator discharge fluid to obtain gas molar composition;

performing oil characterization on the separator discharge fluid to obtain oil density and oil molecular weight; and determining, during operation of the separator and without accessing the separator inlet fluid, composition of the separator inlet fluid by:

performing a first simulation of the separator based on the gas molar composition, the oil density, the oil molecular weight, and a gas oil ratio (GOR) of the separator discharge fluid to obtain a first simulated composition value of the separator inlet fluid, wherein the first simulation is performed using a simulator;

performing a second simulation of the separator based on the first simulated composition value of the separator inlet fluid to obtain a second simulated composition value of the separator discharge fluid, wherein the second simulation is performed using the simulator;

comparing the second simulated composition value of the separator discharge fluid and an actual composition value of the separator discharge fluid to generate a difference, wherein the actual composition value of the separator discharge fluid is obtained from the sample; and presenting the first simulated composition value of the separator inlet fluid, when the difference is less than a threshold value.

2. The method of claim 1, further comprising:
when the difference is greater than the threshold value:
performing a third simulation of the separator based on the second simulated composition value of the separator discharge fluid to obtain an updated first simulated composition value of separator inlet fluid, wherein the third simulation is performed using the simulator;
performing a fourth simulation of the separator based on the updated first simulated composition value of separator inlet fluid to obtain an updated second simulated composition value of the separator discharge fluid, wherein the fourth simulation is performed using the simulator;
comparing the updated second simulated composition value of the separator discharge fluid and the actual composition value of the separator discharge fluid to generate an updated difference; and
presenting the updated first simulated composition value of the separator inlet fluid, when the updated difference is less than the threshold value.

3. The method of claim 1, further comprising:
adjusting the production operations based on the first simulated composition value of the separator inlet fluid.

4. The method of claim 3, wherein at least one of the production operations is adjusted in real-time.

5. The method of claim 1, wherein the separator is a first stage separator.

6. The method of claim 1, wherein the simulator is a multiflash simulator.

7. The method of claim 1, wherein a water cut is set to zero in the first simulation.

8. The method of claim 1, wherein the fluid comprises oil, natural gas, and water.

9. The method of claim 1, wherein the fluid comprises oil and water.

10. A method of performing production operations of an oilfield having at least one process facility and at least one wellsite operatively connected thereto, each at least one wellsite having a wellbore penetrating a subterranean formation for extracting fluid from an underground reservoir therein, the method comprising:

obtaining, during operation of a separator, a sample of separator discharge fluid from the separator, wherein the separator is (a) receiving separator inlet fluid extracted from the underground reservoir and (b) separating oil, gas, and water from the separator inlet fluid to produce the separator discharge fluid;

performing gas chromatography on the separator discharge fluid to obtain gas molar composition;

performing oil characterization on the separator discharge fluid to obtain oil density and oil molecular weight; and determining, during operation of the separator and without accessing the separator inlet fluid, composition of the separator inlet fluid by:

performing a first simulation of the separator based on the gas molar composition, the oil density, the oil molecular weight, and a gas oil ratio (GOR) of the separator discharge fluid to obtain a first simulated composition value of the separator inlet fluid, wherein the first simulation is performed using a simulator;

performing a second simulation of the separator based on the first simulated composition value of the separator inlet fluid to obtain a second simulated composition value of the separator discharge fluid, wherein the second simulation is performed using the simulator; and comparing the second simulated composition value of the separator discharge fluid and an actual composition value of the separator discharge fluid to generate a difference, wherein the actual composition value of the separator discharge fluid is obtained from the sample; and adjusting the production operations based on the first simulated composition value of the separator inlet fluid, when the difference is less than the threshold value.

11. The method of claim 10, further comprising:
when the difference is greater than the threshold value:
performing a third simulation of the separator based on the second simulated composition value of the separator discharge fluid to obtain an updated first simulated composition value of the separator inlet fluid, wherein the third simulation is performed using the simulator;
performing a fourth simulation of the separator based on the updated first simulated composition value of the separator inlet fluid to obtain an updated second simulated composition value of the separator discharge fluid, wherein the fourth simulation is performed using the simulator;
comparing the updated second simulated composition value of the separator discharge fluid and the actual composition value of the separator discharge fluid to generate an updated difference; and
adjusting production operations based on the updated first simulated composition value of separator inlet fluid, when the updated difference is less than the threshold value.

12. A non-transitory computer readable medium, embodying instructions executable by the computer to perform method steps for performing production operations of an oilfield having at least one process facilities and at least one wellsite operatively connected thereto, each at least one wellsite having a wellbore penetrating a subterranean formation for extracting fluid from an underground reservoir therein, the instructions comprising functionality to:
  obtain, during operation of a separator, a sample of separator discharge fluid from the separator, wherein the separator is (a) receiving separator inlet fluid extracted from the underground reservoir and (b) separating oil, gas, and water from the separator inlet fluid to produce the separator discharge fluid;
  perform gas chromatography on the separator discharge fluid to obtain gas molar composition;
  perform oil characterization on the separator discharge fluid to obtain oil density and oil molecular weight; and
  determine, during operation of the separator and without accessing the separator inlet fluid, composition of the separator inlet fluid by:
    performing a first simulation of the separator based on the gas molar composition, the oil density, the oil molecular weight, and a gas oil ratio (GOR) of the separator discharge fluid to obtain a first simulated composition value of the separator inlet fluid, wherein the first simulation is performed using a simulator;
    performing a second simulation of the separator based on the first simulated composition value of the separator inlet fluid to obtain a second simulated composition value of the separator discharge fluid, wherein the second simulation is performed using the simulator;
    comparing the second simulated composition value of the separator discharge fluid and an actual composition value of the separator discharge fluid to generate a difference, wherein the actual composition value of the separator discharge fluid is obtained from the sample; and
    presenting the first simulated composition value of the separator inlet fluid, when the difference is less than a threshold value.

13. The non-transitory computer readable medium of claim 12, further comprising instructions to:
  when the difference is greater than the threshold value:
  perform a third simulation of the separator based on the second simulated composition value of the separator discharge fluid to obtain an updated first simulated composition value of separator inlet fluid, wherein the third simulation is performed using the simulator;
  perform a fourth simulation of the separator based on the updated first simulated composition value of the separator inlet fluid to obtain an updated second simulated composition value of the separator discharge fluid, wherein the fourth simulation is performed using the simulator;
  compare the updated second simulated composition value of the separator discharge fluid and the actual composition value of the separator discharge fluid to generate an updated difference; and
  present the updated first simulated composition value of separator inlet fluid, when the updated difference is less than the threshold value.

14. The non-transitory computer readable medium of claim 12, further comprising instructions to:
  adjust the production operations based on the first simulated composition value of the separator inlet fluid.

15. The non-transitory computer readable medium of claim 14, wherein at least one of the production operations is adjusted in real-time.

16. The non-transitory computer readable medium of claim 12, wherein the separator is a first stage separator.

17. The non-transitory computer readable medium of claim 12, wherein the simulator is a multiflash simulator.

18. The non-transitory computer readable medium of claim 12, wherein a water cut is set to zero in the first simulation.

19. The non-transitory computer readable medium of claim 12, wherein the fluid comprises oil, natural gas, and water.

20. The non-transitory computer readable medium of claim 12, wherein the fluid comprises oil and water.

21. A non-transitory computer readable medium, embodying instructions executable by the computer to perform method steps for performing production operations of an oilfield having at least one process facilities and at least one wellsite operatively connected thereto, each at least one wellsite having a wellbore penetrating a subterranean formation for extracting fluid from an underground reservoir therein, the instructions comprising functionality to:
  obtain, during operation of a separator, a sample of separator discharge fluid from the separator, wherein the separator is (a) receiving separator inlet fluid extracted from the underground reservoir and (b) separating oil, gas, and water from the separator inlet fluid to produce the separator discharge fluid;
  perform gas chromatography on the separator discharge fluid to obtain gas molar composition;
  perform oil characterization on the separator discharge fluid to obtain oil density and oil molecular weight; and
  determine, during operation of the separator and without accessing the separator inlet fluid, composition of the separator inlet fluid by:
    performing a first simulation of the separator based on the gas molar composition, the oil density, the oil molecular weight, and a gas oil ratio (GOR) of the separator discharge fluid to obtain a first simulated composition value of the separator inlet fluid, wherein the first simulation is performed using a simulator;
    performing a second simulation of the separator based on the first simulated composition value of the separator inlet fluid to obtain a second simulated composition value of the separator discharge fluid, wherein the second simulation is performed using the simulator; and
    comparing the second simulated composition value of the separator discharge fluid and an actual composition value of the separator discharge fluid to generate a difference, wherein the actual composition value of the separator discharge fluid is obtained from the sample; and
  adjusting the production operations based on the first simulated composition value of the separator inlet fluid, when the difference is less than the threshold value.

22. The non-transitory computer readable medium of claim 21, further comprising instructions to:
  when the difference is greater than the threshold value:
  perform a third simulation of the separator based on the second simulated composition value of the separator discharge fluid to obtain an updated first simulated composition value of separator inlet fluid, wherein the third simulation is performed using the simulator;
  perform a fourth simulation of the separator based on the updated first simulated composition value of the separator inlet fluid to obtain an updated second simulated composition value of the separator discharge fluid, wherein the fourth simulation is performed using the simulator;
compare the updated second simulated composition value of the separator discharge fluid and the actual composition value of the separator discharge fluid to generate an updated difference; and adjust the production operations based on the updated first simulated composition value of the separator inlet fluid, when the updated difference is less than the threshold value.

* * * * *